United States Patent
Bhattacharya et al.

(10) Patent No.: US 6,782,514 B2
(45) Date of Patent: Aug. 24, 2004

(54) CONTEXT-SENSITIVE CONSTRAINT DRIVEN UNIQUIFICATION AND CHARACTERIZATION OF STANDARD CELLS

(75) Inventors: Debashis Bhattacharya, Plano, TX (US); Vamsi Boppana, Santa Clara, CA (US)

(73) Assignee: Zenasis Technologies, Inc., Campbell, CA (US)

( * ) Notice: Subject to any disclaimer, the term of this patent is extended or adjusted under 35 U.S.C. 154(b) by 81 days.

(21) Appl. No.: 10/056,343

(22) Filed: Jan. 24, 2002

(65) Prior Publication Data

US 2003/0140319 A1 Jul. 24, 2003

(51) Int. Cl.[7] .............................................. G06F 17/50
(52) U.S. Cl. ............................. 716/3; 716/2; 716/18; 716/7; 716/17
(58) Field of Search .............................. 716/3, 2, 18, 7, 716/17

(56) References Cited

U.S. PATENT DOCUMENTS

| | | | | | |
|---|---|---|---|---|---|
| 5,031,111 A | * | 7/1991 | Chao et al. | ...................... | 716/7 |
| 5,140,526 A | * | 8/1992 | McDermith et al. | .......... | 705/28 |
| 5,394,338 A | * | 2/1995 | Shinohara et al. | ............. | 716/11 |
| 5,416,718 A | * | 5/1995 | Yamazaki | ...................... | 716/5 |
| 5,459,673 A | * | 10/1995 | Carmean et al. | ................ | 716/6 |
| 5,586,046 A | * | 12/1996 | Feldbaumer et al. | .......... | 716/18 |
| 5,689,432 A | * | 11/1997 | Blaauw et al. | ................. | 716/18 |
| 5,726,903 A | * | 3/1998 | Kerzman et al. | ............... | 716/2 |
| 5,764,525 A | * | 6/1998 | Mahmood et al. | ............. | 716/18 |
| 5,898,595 A | * | 4/1999 | Bair et al. | ...................... | 716/2 |
| 5,960,184 A | * | 9/1999 | Cleereman et al. | ............ | 716/3 |
| 6,031,980 A | * | 2/2000 | Oota | ............................... | 716/8 |
| 6,066,178 A | * | 5/2000 | Bair et al. | ...................... | 716/2 |
| 6,086,626 A | * | 7/2000 | Jain et al. | ....................... | 716/5 |
| 6,148,433 A | * | 11/2000 | Chowdhary et al. | ........... | 716/1 |
| 6,190,433 B1 | * | 2/2001 | Van Fleet et al. | ............... | 71/18 |
| 6,275,973 B1 | * | 8/2001 | Wein | ............................ | 716/10 |
| 6,282,695 B1 | * | 8/2001 | Reddy et al. | .................. | 716/18 |
| 6,321,367 B1 | * | 11/2001 | Chun et al. | .................... | 716/8 |
| 6,470,486 B1 | * | 10/2002 | Knapp | .......................... | 716/18 |
| 6,473,881 B1 | * | 10/2002 | Lehner et al. | .................. | 716/2 |

(List continued on next page.)

FOREIGN PATENT DOCUMENTS

WO    WO 200142994 A2 *  6/2001   ........... G06F/17/50

OTHER PUBLICATIONS

Dutt et al., "Bridging high–level synthesis to RTL technology libraries", Proceedings of the 28th ACM/IEEE Design Automation Conference, Jun. 17, 1991, pp. 526–529.*

(List continued on next page.)

*Primary Examiner*—Matthew Smith
*Assistant Examiner*—Phallaka Kik
(74) *Attorney, Agent, or Firm*—Ohlandt, Greeley, Ruggiero & Perle, L.L.P.

(57) ABSTRACT

The present invention relates to a method for minimizing the number of standard cells required to implement a digital circuit and for improving the characterization of new standard cells based on their context/environment. In addition, a systematic method that utilizes detailed characterization at the transistor-level on critical areas of the design for improved characterization and optimization of the entire design is presented.

23 Claims, 9 Drawing Sheets

U.S. PATENT DOCUMENTS

| | | | | | |
|---|---|---|---|---|---|
| 6,490,708 | B2 | * | 12/2002 | Cohn et al. ..................... | 716/4 |
| 6,519,609 | B1 | * | 2/2003 | Touzet ..................... | 707/104.1 |
| 6,523,156 | B2 | * | 2/2003 | Cirit ............................... | 716/9 |
| 6,536,018 | B1 | * | 3/2003 | Chisholm et al. .............. | 716/4 |
| 6,567,971 | B1 | * | 5/2003 | Banzhaf et al. ............... | 716/18 |
| 6,574,779 | B2 | * | 6/2003 | Allen et al. ..................... | 716/1 |
| 6,591,407 | B1 | * | 7/2003 | Kaufman et al. ............. | 716/10 |
| 6,594,808 | B1 | * | 7/2003 | Kale et al. ...................... | 716/8 |
| 6,611,943 | B2 | * | 8/2003 | Shibata et al. ................. | 716/1 |
| 6,618,834 | B2 | * | 9/2003 | Takeyama et al. ............. | 716/2 |
| 6,704,917 | B1 | * | 3/2004 | Curran et al. .................. | 716/11 |
| 2002/0083398 | A1 | * | 6/2002 | Takeyama et al. ............. | 716/1 |
| 2003/0177455 | A1 | * | 9/2003 | Kaufman et al. .............. | 716/2 |

OTHER PUBLICATIONS

Dutt, "Legend: a language for generic component library description", IEEE Comput. Soc. Press, 1990 International Conferenc on Computer Languages, Mar. 12, 1990, pp. 198–207.*

Asdjodi, "ELL: Extendable Library Language", IEEE Comput. Soc. Press, Proceedings of the Twenty–Third Annual Hawaii International Conference on System Sciences, vol. 2, Jan. 2, 1990, pp. 257–266.*

Sait et al., "Design of a cell library for formal high level synthesis", IEEE, Proceedings of the 7th Mediterranean Electrotechnica Conference, Apr. 12, 1994, vol. 3, pp. 1238–1241.*

Foo et al., "Databases and cell–selections algorithms for VLSI cell libraries", IEEE Comput. Soc., vol. 23, No. 2, Feb. 1990, pp. 18–30.*

Rao et al., "On clustering for maximal regularity extraction", IEEE Transactions on Computer–Aided Design of Integrated Circui and Systems, vol. 12, No. 8, Aug. 1993, pp. 1198–1208.*

Veselinovic et al., "A flexible topology selection program as part of an analog synthesis system", IEEE Comput. Soc. Press, Proceedings of the European Design and Test Conference, Mar. 6, 1995, pp. 119–123.*

Herbert, "An integrated design and characterization environment for the development of a standard cell library", Proceedings o the IEEE 1991 Custom Integrated Circuits Conference, May 12, 1991, pp. 25.6/1–25.6/5.*

Kurosawa et al., "Automation of user–specific ASIC library development", IEEE, Proceedings of the Fourth Annual IEEE International ASIC Conference and Exhibit, Sep. 23, 1991, pp. P14–7/1–5.*

Tsareff et al., "An expert system approach to paramterized module synthesis", IEEE Circuits and Devices Magazine, vol. 4, No. 1, Jan. 1988, pp. 28–36.*

Royals et al., "Creating the IC palette (ASIC design)", IEEE Comput. Soc., First international Workshop on Rapid System Prototyping: Shortening the Path from Specification to Prototype, Jun. 4, 1990, pp. 76–86.*

Neubert et al., "Top–down knowledge acquisition", IEEE Comput. Soc. Press, Proceedings of the Second International Conference on Expert Systems for Development, Mar. 28, 1994, pp. 108–113.*

Rao, "An open environment for standard cell and gate array library development", IEEE Comput. Soc. Press, Proceedings of EURO ASIC '92, Jun. 1, 1992, pp. 72–77.*

Rehani et al., "A framework for building cell libraries with novel devices", IEEE, vol. 1, Jan. 1, 1994, pp. 432–436.*

Lin et al., "Delay and area optimization in standard–cell design", IEEE, 27th ACM/IEEE Design Automation Conference, Jun. 24 1990, pp. 349–352.*

Kazuo Taki, "*A Survey for Pass–Transistor Logic Technologies*", IEEE, 1998, pp. 223–226.

Mineo Kaneko and Jialin Tian, "*Concurrent Cell Generation and Mapping for CMOS Logic Circuits*", IEEE, 1997, pp. 247–259.

* cited by examiner

CONTEXT-SENSITIVE CONSTRAINT DRIVEN UNIQUIFICATION AND CHARACTERIZATION OF STANDARD CELLS

BACKGROUND OF THE INVENTION

1. Field of the Invention

This invention relates to a method and system for optimizing the creation, utilization, and characterization of standard cells used in the design of integrated circuits, that are particularly suitable for design-specific standard cells.

2. Description of the Related Art

Integrated circuits (ICs) form the heart of electronic engineering technology. The design and fabrication processes of ICs are extremely complex. Numerous methodologies, based on various technologies and tools, are known for accomplishing the design and fabrication of ICs. Prominent IC design methodologies include custom, semi-custom, gate-array, standard-cell, FPGA (field-programmable gate arrays).

It is generally accepted that standard cell based solutions provide an acceptable balance in terms of cost and performance for the implementation of ASICs (application specific integrated circuits), as well as several other forms of ICs. A typical standard-cell based design is implemented using a specific set of predefined logic cells referred to as standard-cells. The set of standard-cells is typically referred to as a library. Each (unique) standard cell is typically instantiated multiple times and the IC design is realized by the creation of appropriate interconnections between the instantiations.

Popular methods for implementing a standard cell based IC design use a fixed library of standard-cells for multiple designs. While a typical state-of-the-art standard-cell library may contain as many as several hundred to a thousand or more cells, IC design synthesis tools tend to use a small subset of the available cells—typically in the range of 80–200 unique cells. Consequently, there is a great need to efficiently identify the cells in a given library that may be able to provide a better implementation of the functionality of a design, as measured using commonly used metrics such as performance or area.

More recently, digital IC design methodologies have been developed that utilize on-the-fly generation of standard cells as disclosed in commonly assigned U.S. patent Ser. No. 09/896,071, now U.S. patent application Publication Ser. No. 20020053063, entitled Process for Automated Generation of Design-Specific Complex Functional Blocks to Improve Quality of Synthesized Digital Integrated Circuits in CMOS, and incorporated herein by reference. In order to improve the efficiency of such design methodologies, there exists the need to (1) reduce the number of unique cells required to implement the design (Uniquification); and (2) efficiently characterize the properties of newly implemented cells (Characterization).

A primary focus in conventional, automated, design methodologies is placed on effective technology mapping. That is, the process of mapping the design to an existing technology-dependent library of standard-cells. The most important step in the mapping process is that of matching a target functional description with the functionality of a physical implementation (e.g., a standard-cell). For example, consider the example of FIG. 1. The target function f=(xy+zy)' can be implemented by available AOI cell 105 in the library whose functionality is given by f=(a(b+c))'.

However, in order to achieve this implementation, the inputs of the target function would need to be permutated in a certain order. In this example, two such permutations can result in an implementation of the target function with AOI cell 105. The two permutations that can result in a match in functionality are (a:y, b:x, c:z) and (a:y, b:z, c:x), as shown in the table of FIG. 1a.

It should also be noted that a function f=(xy+z'y)' can also be realized by the same AOI cell 105, if inverters were permitted to be used freely in the mapping process. Both of the permutations introduced above would still be valid, except that an inverter is required at the input of the AOI cell that matches the z input of the target cell in order to realize the correct target function. For example, in the permutation (a:y, b:x, c:z), the input c requires an inverter in order to realize the target function.

The technology mapping problem is well-known in conventional logic synthesis, it belongs to the category of computationally difficult problems designated as NP-hard. The problem is hard because of the necessity to consider exhaustive input permutations in order to realize potential matches, and the number of possible input permutations grows exponentially with the number of inputs. It is also known that the problem becomes much harder if input complementation is allowed in addition to permutation during the mapping process.

Previous work related to the uniquification problem has primarily addressed the issue of efficient matching of target functionality with the pre-existing library of standard-cells after considering potential permutations and complementation of inputs.

Present techniques to solve this matching problem use functional signatures to eliminate the necessity for the exhaustive generation of permutations and to limit the search space to a manageable size. Functional signatures capture essential properties of a given function (or library cell) that remain invariant even under input permutations/complementation. For example, the size of the ON-set of a function remains invariant under a permutation of input variables. Several other types of functional signatures are also known.

There also exists related work in the area of functional verification that attempts to match portions of a digital circuit (specification) with portions of another digital circuit (implementation) with an objective of comparing their functional equivalences. Techniques used in this area rely on both structural and functional information in order to identify similar portions of the specification and the implementation. In contrast with technology mapping techniques, functional verification techniques can use structural information since the structural views for both the implementation and the specification are known and available.

Characterization refers to the process by which standard cells designed for use in digital ICs designs are extensively analyzed for a number of characteristics such as, but not limited to, timing, power, area, noise, slew, load capacitance, drive strength, and footprint (i.e., size).

Most of the previous work in the area of characterization has focused on methods for reducing simulation times required for characterization. The methods used were typically based on improved models of the underlying devices and better numerical solution methods to solve the mathematical equations formed by modeling the underlying devices.

Prior work on improving the characterization accuracy of the design primarily concentrated on either (1) improving the gate-level timing analysis by considering such issues as false-paths or (2) by performing a characterization of the entire design at the transistor-level for a small set of all possible inputs (since it is not computationally feasible to completely characterize large designs at the transistor-level).

Much of the previous work related to characterization has focused on reducing the time required for extensive circuit simulation. A major disadvantage of previous efforts in the area of characterization is the assumption that the cells are typically designed and characterized without an idea of their potential points of instantiation in any design.

SUMMARY OF THE INVENTION

The present invention discloses methods for effectively solving all of the problems mentioned above for both traditional design methodologies (e.g., custom, semi-custom, gate-array, standard-cell, FPGA), as well as for newly developed and emerging IC design methodologies. The present invention also provides a method for accurately characterizing the overall IC design based on creating and accurately characterizing large regions of the design at the transistor-level.

The present teachings include a method for improving the utilization of existing cells in a standard-cell library, minimizing the number of new standard-cells created to implement a digital circuit when on-the-fly creation of standard cells is allowed, and improving the characterization of standard-cells given their context-of-use or environment. Also provided is an accurate method for characterizing the entire design based on creating and accurately characterizing groups of standard-cells at the transistor-level.

In accordance with the present teachings, the method and system of minimizing the number of unique standard cells required to implement the digital circuit is referred to herein as uniquification. As used herein, characterization refers to a process by which a logic cell is analyzed extensively for its characteristic properties, such as pin-to-pin rise/fall times and power consumption. The characterization aspects of the present teachings are applicable over a wide variety of environmental conditions, such as the various semiconductor process nodes at which the cell can be fabricated.

Conventional standard cell-based design flows involve the creation of a fixed set of standard-cells (called a library), and their use (instantiation) in implementing multiple designs. Recent efforts to improve design performance have resulted in a new design flow in which the generation of cells with entirely new functionality is performed on-the-fly, i.e., in a dynamic manner. In this context, the following considerations are relevant: minimization of the number of unique new standard-cells that need to be generated; the reduction in the resources required for characterizing the new standard-cells; and the accuracy of results achieved by the characterization process.

In contrast to other techniques related to the uniquification problem, the present teachings disclose a method and system for identifying matching cells based on at least the following set of criteria: target functionality of the required cell, considering potential permutations and complementation of inputs; and target constraints on the properties of the required cell such as pin-to-pin rise/fall times, input/output capacitances, switching capacitances, power, foot-prints, noise margins, pin-placement, etc.

In contrast to other characterization techniques, the present invention provides effective utilization of restrictions/information regarding the operating environment (i.e., context-of-use) of the standard-cell(s) being characterized. Such restrictions/information may be derived from context-specific knowledge, as is true for the new design flows that generate cells on-the-fly, where the points of instantiation of any cell in a design are known. This knowledge is used to reduce the resources required for characterizing new standard-cells and for improving the accuracy of the characterization process. In addition to the design environment knowledge, constraints utilized by the present invention may come from other data concerning the cell and its intended use.

The above and other objects, advantages, and benefits of the present invention will be understood by reference to following detailed description and appended sheets of drawings.

DETAILED DESCRIPTION OF THE INVENTION

To reiterate, recent efforts to improve design performance have resulted in a new IC design flow in which the generation of cells with entirely new functionality is performed on-the-fly. These cells may be introduced into an existing library of cells, thereby complying with conventional design flow methods. Moreover, such new design flows attempt to better utilize existing cells in a given standard-cell library, even if conventional synthesis processes fail to utilize existing cells—as is commonly the case.

In order to more effectively implement such design flows, procedures for performing context-sensitive and constraint-driven uniquification, and context-sensitive characterization become important. It should be noted that the library of logic cells in the IC design flows considered herein may include cells added during the optimization phase of the original library before the start of the uniquification and characterization procedures of the present invention.

Figures 1, 1A:
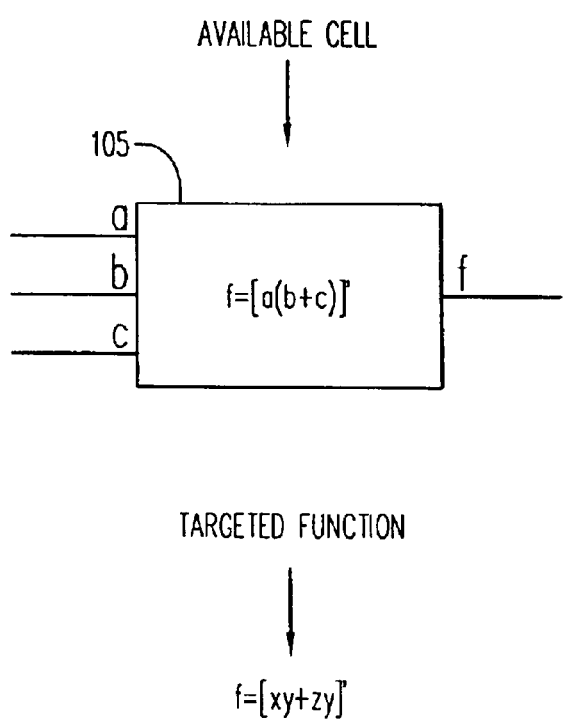
FIG. 1 is a depiction of a standard-cell for implementing a logic function.
FIG. 1a is table listing the functional matches for the standard-cell of FIG. 1.

As previously discussed, prior attempts have been made to address the problem of matching a target functional description with the functionality of a physical implementation. Methodologies employed by prior approaches to perform such matching were illustrated in connection with the discussion of FIG. 1. Additionally, there exists related work that attempts to match portions of a digital circuit (specification) with portions of another digital circuit (implementation) with an objective of comparing their functional equivalences, utilizing both structural and functional information.

In contrast with heretofore methodologies in the area of digital circuit specification and implementation matching, the present invention addresses the problem in the context of constraints. Thus, in addition to functionality, the target for matching is annotated with constraints that preferably relate to the target design's use in a design environment.

Since one of the goals of these teachings is to provide support for design flows where cells are generated on-the-fly, the target cell in the library preferably satisfies both the functionality (subject to any permutations/complementations of the sell inputs) and the cell's target constraints. Constraints specified as part of the target may be related to, for example, timing, power, area, noise margins, slew, input/output capacitances, switching capacitances, drive strength, footprint size, pin-placement, etc.

It should be appreciated that the addition of constraints most often decreases the potential of any matches in a specific (i.e., given) library of cells. Referring the FIG. 2 there is shown an example for the matching problem of FIG. 1, with added constraints 220 on the rise and fall timing on the pin-pair z-f. Specifically, the worst z-f rise transition is required to occur in exactly 0.15 ns and the worst z-f fall transition is required to occur in exactly 0.12 ns. These constraints reduce the potential matches from two as shown in FIG. 2a at 205 and 210, if only functional information is considered, to one, i.e., (a:y, b:z, c:x) 215. This is the only match that satisfies the functionality and the timing constraints.

Figure 2:
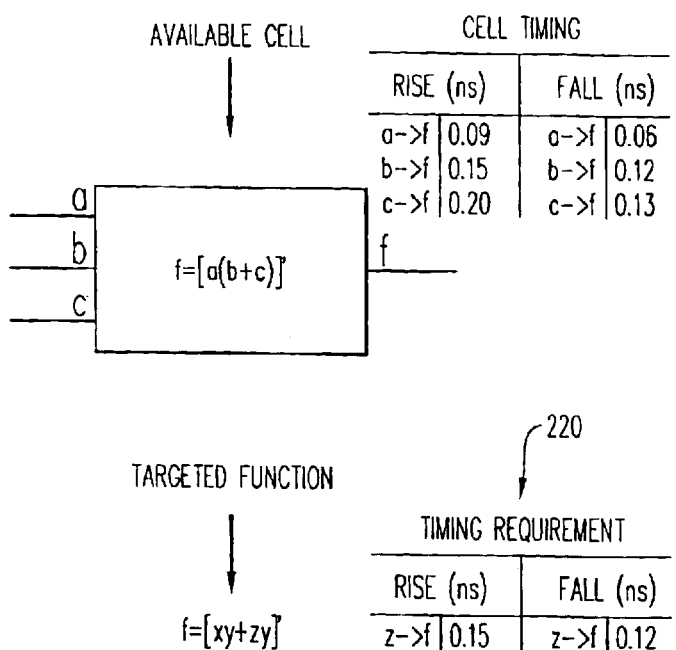
FIG. 2 is a depiction of a logic cell for implementing a logic function, including a timing chart.
Figure 2A:
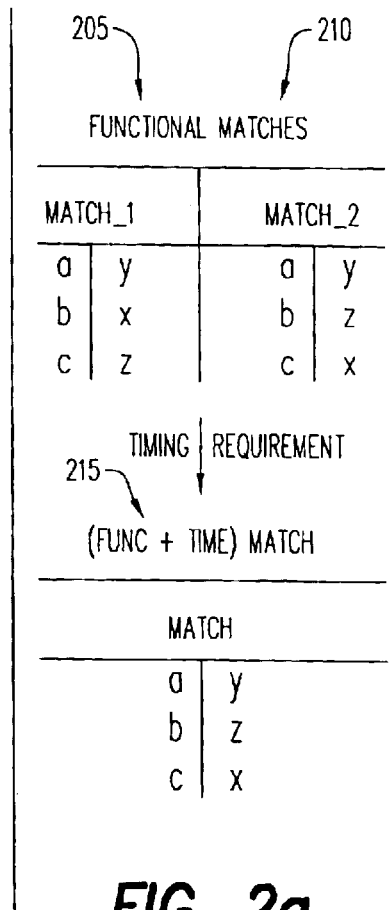
FIG. 2a is table listing the matches for the cell of FIG. 2, taking into account both function and timing.

The timing constraints of the example of FIG. 2 were exact. However, during optimization, it is often the case that the target constraints may not be exact. For example, it might be acceptable for a cell to match the target timing constraint within a certain bound or variance. In fact, most constraints are naturally expressed as values within a range. For example, a timing constraint may be expressed as having a rise time that should be no worse than 0.23 ns.

Figures 3, 3A:
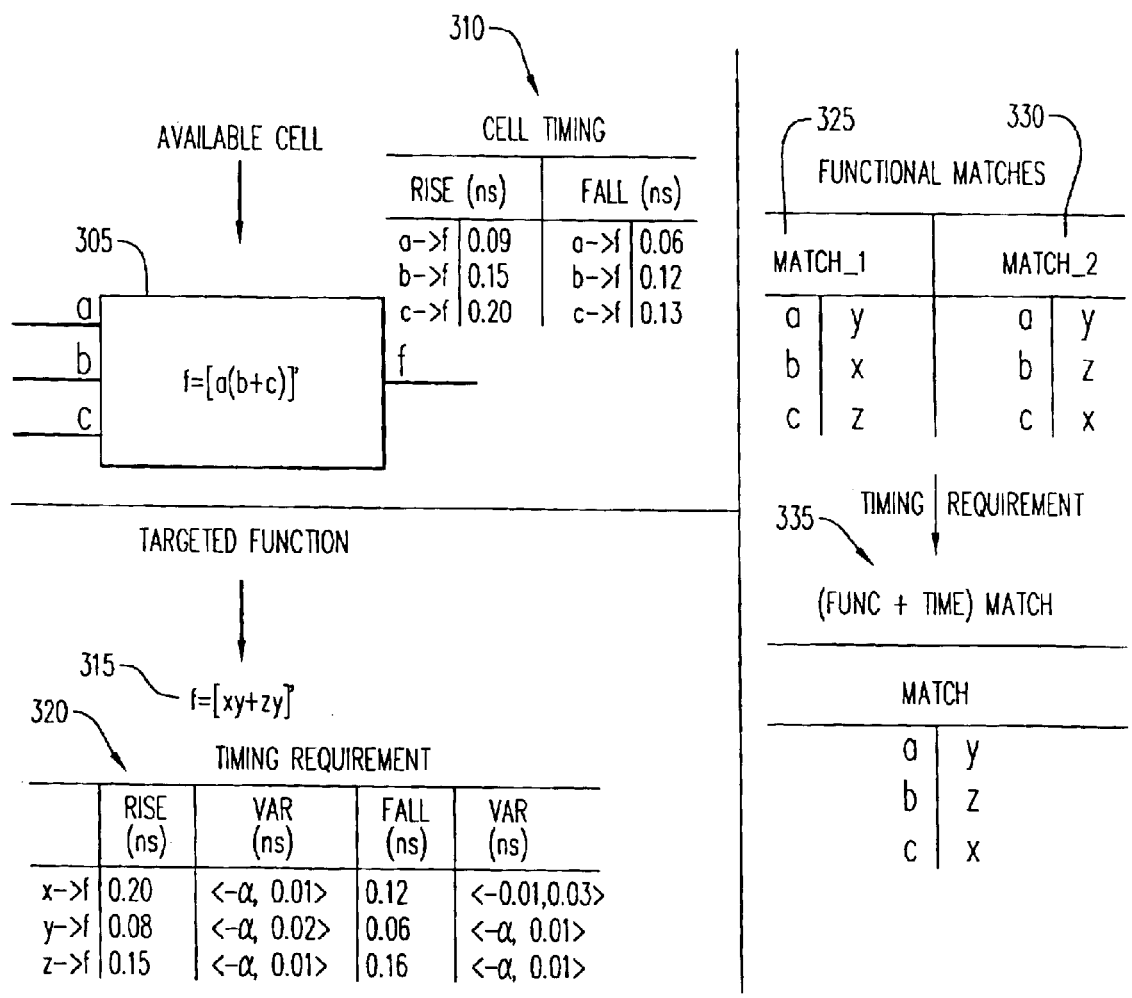
FIG. 3 is a depiction of a logic cell for implementing a logic function, including a timing chart listing timing variances.
FIG. 3a is table listing the matches for the cell of FIG. 3, taking into account function, timing, and timing variance.

In order to capture variances in timing, the present invention proposes that a constraint is preferably expressed in terms of a nominal value and associated range. For example, consider FIG. 3 that includes the concept of a variance to the example of FIG. 2. Each input pin to the output pin has a rise and a fall time constraint expressed in terms of a nominally required value and a variance as shown in a cell timing chart 310. Cell timing chart 310 includes a lower bound on the variance and an upper bound on the variance. For example, the constraint on pin x-f can now be interpreted as having a rise time delay that is preferred to be 0.20 ns, but is no worse than 0.21 (i.e., 0.20+0.01)ns and is no smaller than $-\infty$ (0.20-$\infty$)ns. With these criteria, the only potential match satisfying the functionality and constraints in this example is that of (a:y, b:z, c:x), 335.

Similar to the timing constraints and variances illustrated in this example, it is possible to define and use other constraints and variances for other objectives as discussed earlier. Thus, the exemplary discussions presented herein should not be viewed as limitations of the present teachings.

In a departure from other work related to the area of uniquification, the present teachings incorporate and use variances on constraints for matching targets with existing cells in the library.

Since the satisfaction of constraints is a key aspect of the present teachings, another aspect hereof is to develop signatures that capture and filter out impossible matches from the existing library. Consider the example of FIG. 4 that illustrates the construction and use of signatures based on constraints for an example target objective of timing 420.

The signature for the target objective of timing can include, but not necessarily or limited to, a sorted set of rise and fall times. It is important to note that such a sorted list is preferably independent of any permutations on input pins. It is also possible to combine rise and fall times and construct signatures comprised of sorted lists of functions of rise and fall times that would also remain independent of any permutation or potential complementations at the inputs of the library cell (e.g., 405).

In order to account for variances on constraints when computing rise times the signature includes the worst possible rise time (nominal+worst tolerance), and when computing fall times the signature includes the worst possible fall time (nominal+worst tolerance). Similar lists can be constructed with the sorted rise and fall times for the existing library cells and can be matched against the target list for any potential feasible matches. The feasibility is checked by ensuring that for every target constraint value on a pin (e.g., rise time), there exists at least one value on an actual pin that satisfies the constraint.

Figures 4, 4A:
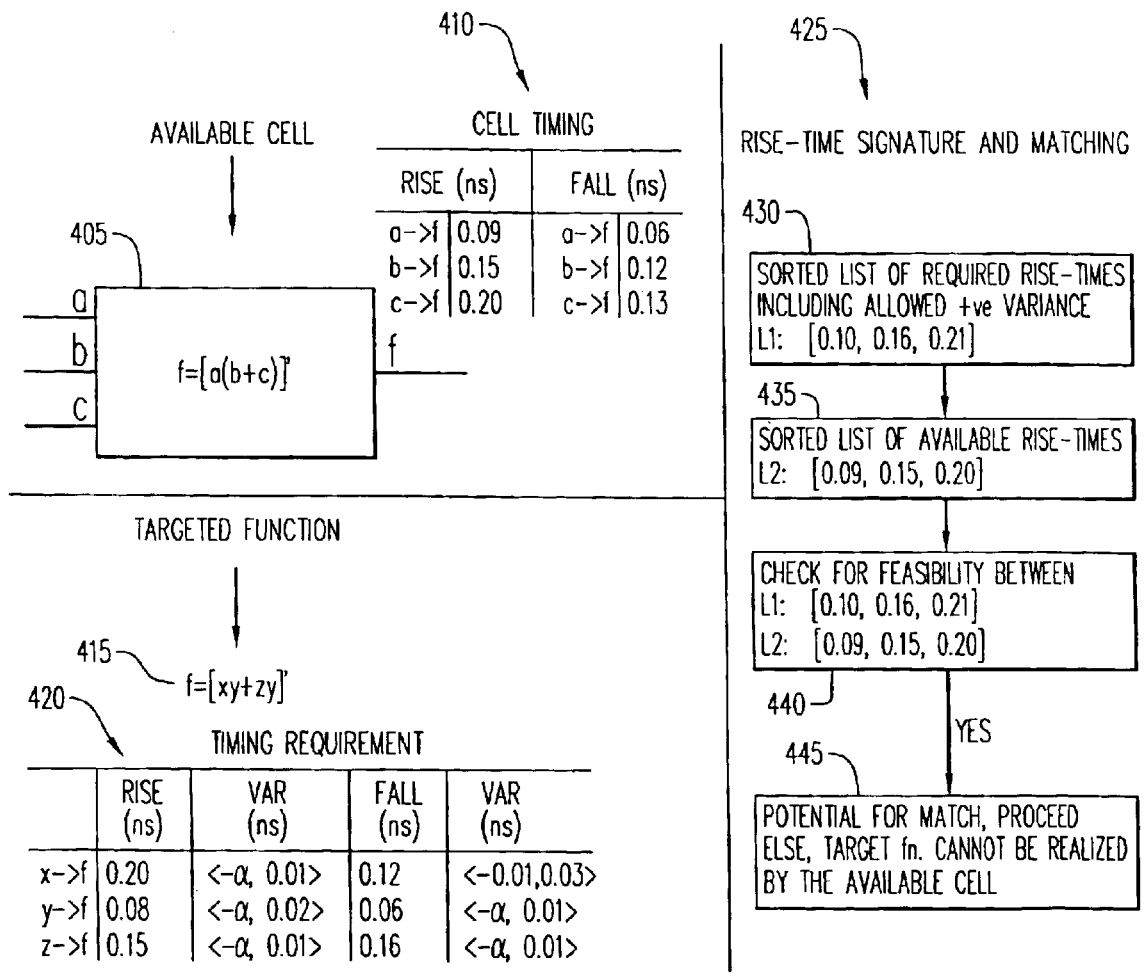
FIG. 4 is an exemplary depiction of a logic cell for implementing a logic function, including a timing chart listing timing variances.
FIG. 4a is a depiction of a logical flow diagram for matching cell function and constraints, including a sorted list of the constraints of FIG. 4.

Additional procedures are preferably employed to check that multiple constraints will be matched by the same available, actual, pin data, as depicted in FIG. 4. In steps 430 and 435, the rise time (nominal+worst tolerance) and fall time (nominal+worst tolerance) constraints are accounted for, respectively, to obtain sorted lists L1 and L2. Sorted lists L1 and L2 are evaluated for feasibility in step 440. Thereafter, the feasibility determination of step 440 is noted (i.e., stored or recorded) in step 445.

Figure 5:
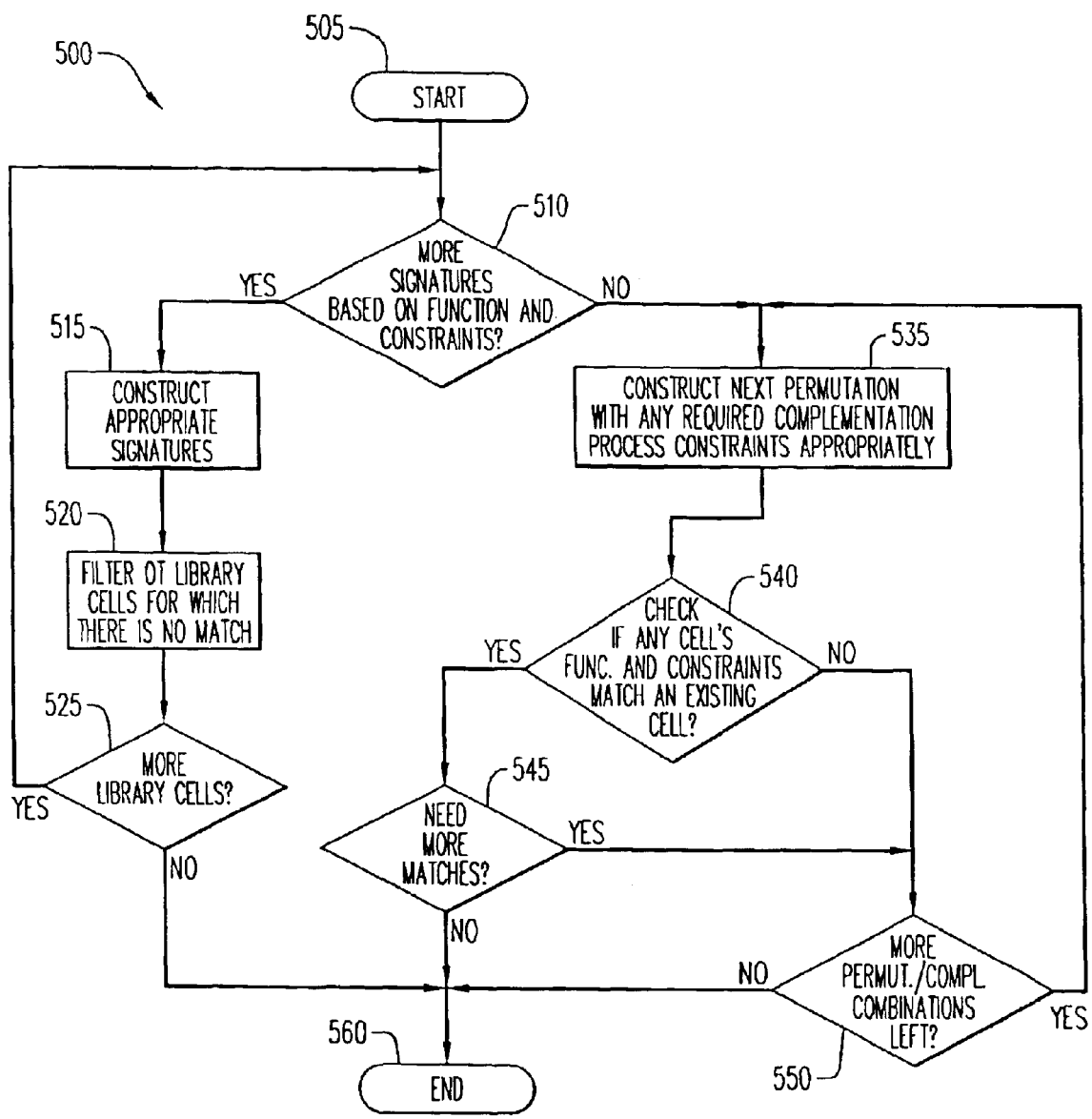
FIG. 5 is a flowchart of an exemplary method for the matching process of the present invention.

The flowchart of FIG. 5 shows an exemplary method for the matching process of the present invention. Flow chart 500 illustrates how multiple signatures can be constructed based on constraints and used for filtering existing library cells and elements. The signature checking phase is performed in steps 510, 515, 520, and 525. Once the signature checking phase is complete, as evidenced by a "no" determination at step 510, exhaustive permutations and complementations are generated at step 535. A determination is next made whether there is an existing cell in the library that satisfies the target functionality and constraints at step 540. The permutations and complementations are exhausted by iteratively performing steps 535, 540, 545, and 550. Once it is determined that the signature checking phase will not yield any additional matches, the matching process is concluded at step 560.

Note that process 500 allows multiple matches to be generated. In the presence of multiple matches, selection criteria can be utilized to select the most appropriate match. Such criteria may include, for example, preferences for certain constraints and how closely the cell matches the given constraints (based on the nominal values).

Again, characterization refers to the process by which standard cells designed for use in digital IC designs are extensively analyzed for a number of characteristics such as, but not limited to, timing, power, area, noise, slew, load, capacitance, drive strength, and footprint. The present invention provides a method and system of characterization wherein cells are preferably characterized on an as needed basis.

That is, in accordance with the present invention, the characterization process is applied to the range of characteristics relevant to the specific context in which the cell is to be used. As such, the characterization aspect of the present invention provides, for example, the benefits of more accurate characterization, and characterization requiring less (computational) resources.

Figure 6:
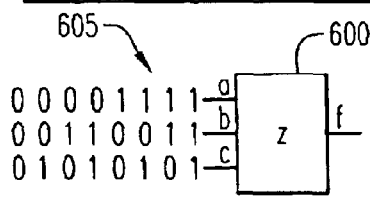
FIG. 6 depicts how a context of use can restrict inputs combinations necessary to characterize a combinational cell Z having three inputs, a, b, and c.
Figure 6:
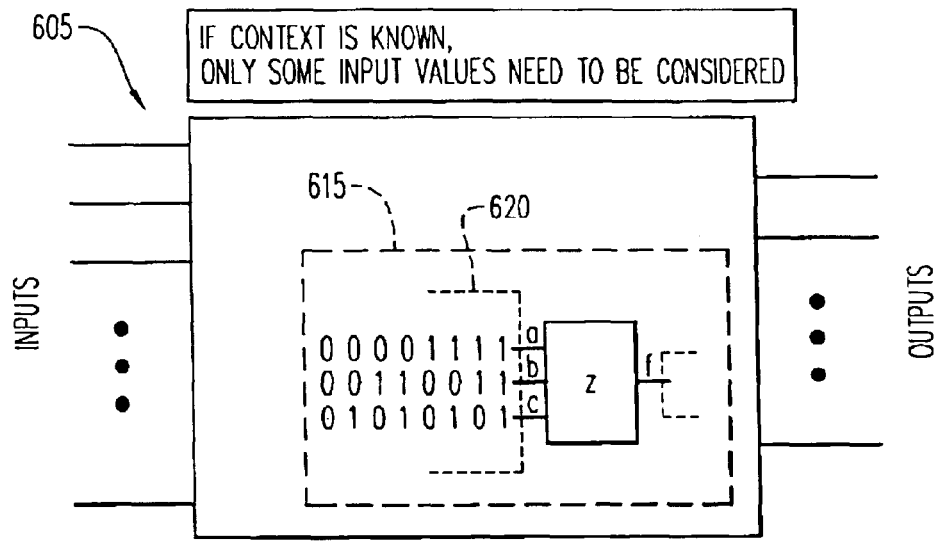

FIG. 6 illustrates a cell Z (600) having three inputs, a, b, and c. In a conventional design methodology, cell Z can be instantiated in any portion of the design. Hence, any characterization method that does not have knowledge of the context in which a cell is to be used has to consider the possibility that any of the possible input combinations are valid.

In contrast, consider the scenario that occurs in the alternative design flows where standard cells are generated on-the-fly. In this scenario (and other possible scenarios), the design environment for a cell might be known. The design environment is defined by the places of instantiation of the cell in the design. Hence, certain combinations of input values may not be possible for application to cell 600 as illustrated in FIG. 6. As shown, only a subset 620 of possible inputs 605 need be considered due to the design context of cell 600.

Therefore, in accordance with the teachings herein, the characterization process performed on the cell may not need to consider all possible input combinations in order to determine the relevant properties for that cell.

Figure 7:
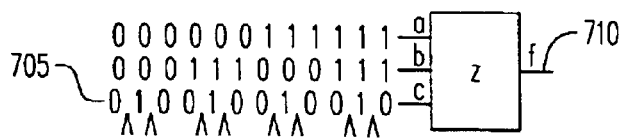
FIG. 7 further demonstrates the use of context of the cell Z of FIG. 6, to minimize complexity of characterization.
Figure 7:
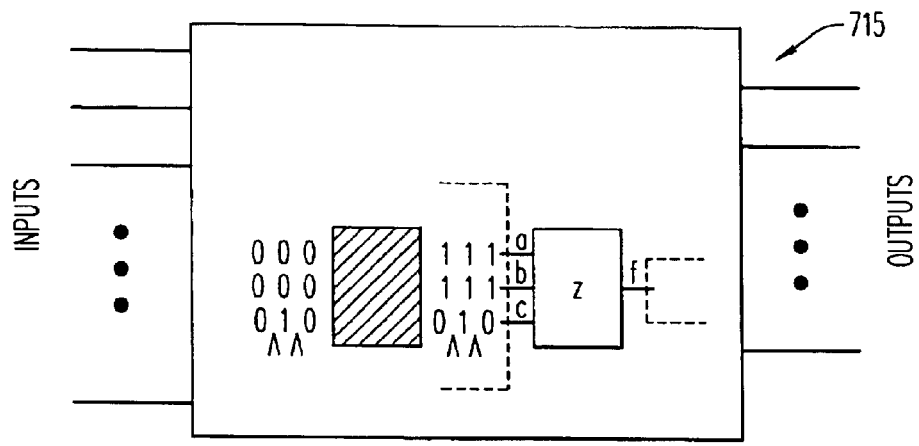

FIG. 7 depicts an exemplary case that illustrates the savings possible by the context-sensitive characterization of the present invention. A goal is to characterize the rise and fall timing behavior for pin pair c-f 705. The typical characterization process applies all possible (0-1) and (1-0) input transitions at input c for all possible combinations of values at the other inputs (a, b) and obtains the worst-case rise and fall times noticed at the output pin f 710.

In accordance with the teachings herein, when the functionality of the cell is known it is also possible to refine the set of characterization vectors. See for example, cel 715 and its associated possible inputs. In fact, the following exemplary coded programming function generates a minimal set of test vectors that provides a complete characterization of a given standard-cell implementing a combinational function:

```
GenerateSmartVectors(function)
{
    // supportSize represents the number of variables
    // that function depends on
    supportSize = function.SupportSize();
    for (i = 0; i < supportSize; i++) {
        // compute boolean difference w.r.t input i
        boolDiffFunction = function.BooleanDifference(i);
        setOfVectors = boolDiffFunction.EnumerateMinterms();
```

-continued

```
        // originalNumVectors += power(2, (supportSize-1));
        // newNumVectors += (boolDiffFunction.CountMinterm())/2;
    }
}
```

Furthermore, if the cell were in the design context as identified in 605 of FIG. 6, it would suffice to apply only the transitions that are indicated in 715, thus saving valuable time and resources required for the characterization process. In order to achieve such savings, it is important to identify the complete set of properties that are necessary for the operation of the cell in its environment. The cell may be further characterized for a different environment having different restrictions.

It should be appreciated the methods herein can be extended to encompass (1) restrictions on the characterization process derived from sources other than those discussed above, including, for example, the number of semiconductor process nodes at which the cell needs to be characterized; (2) restrictions in any form that improves the accuracy or efficiency of the characterization process, for example, a restriction on the number of temperature settings at which simulation needs to be run, so that the characterization process can be completed faster even if the number of vectors stays the same; and (3) characterization used to determine to all relevant properties of the cell, including for example, the power characteristics of the cell.

Figure 8:
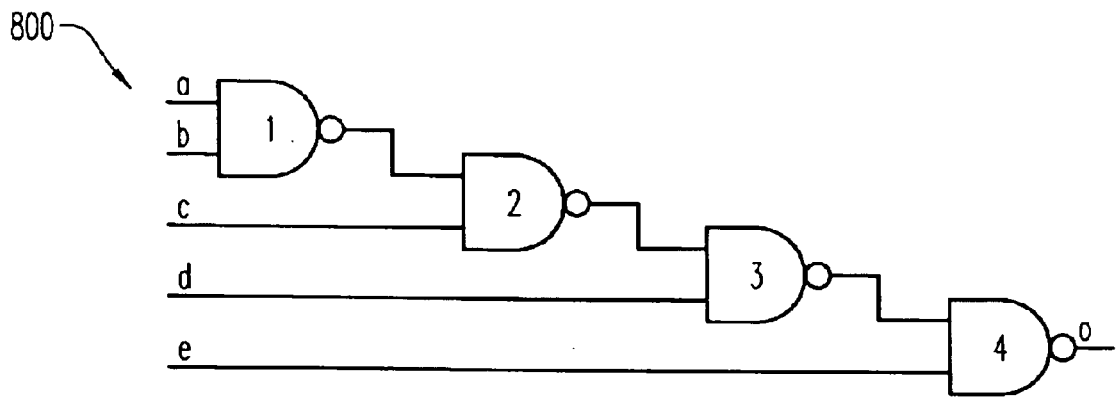
FIG. 8 is an exemplary illustration of the greater accuracy of transistor-level characterization, compared to gate-level static timing analysis (STA) in an exemplary circuit as shown.

An exemplary circuit 800 is shown in FIG. 8 to illustrate the benefits that can be gained from transistor-level characterization of portions of a digital logic circuit as compared to gate-level static timing analysis (STA). Circuit 800 represents a four-stage chain of NAND gates. Table 805 depicts the worst propagation delays through the design as determined by both gate-level STA and transistor-level timing analysis for five circuits. Each row in table 805 represents one unique circuit configuration.

The first column represents the drive strengths of the gates at each stage, where zero (0) represents the smallest drive strength and four (4) represents the largest drive-strength. The second column shows the worst propagation delay through the design as determined by gate-level (STA). The third column represents the worst propagation delay through the same design as determined by transistor-level timing analysis.

Note that the results are based on state-of-the-art process and delay models; and the same load capacitance and input slew values have been used for each of the runs.

It is clear from the data of table 805 that transistor-level timing analysis is much more accurate than gate-level timing analysis. In fact, the differences in timing analyses can be dramatically different in certain kinds of certain configurations as seen in the first circuit configuration (i.e., the first row in the table 805) where each NAND gate is of drive strength 0.

The extent of differences vary based on factors such as the delay models being used, circuit topology, model extraction technology, transistor simulation techniques being used, process in use, circuit design style and drive-strengths of the circuit elements under consideration. Gate-level STA is made inherently conservative to account for potential inaccuracies in the creation of the gate-level abstraction from the transistor-level circuit. Since gate-level analysis is more conservative than transistor-level analysis, it is possible to improve the accuracy of analysis of performance of a design by considering clusters (i.e., partitions or groups) of standard-cells and analyzing and optimizing the clusters at the transistor-level.

Figure 9:
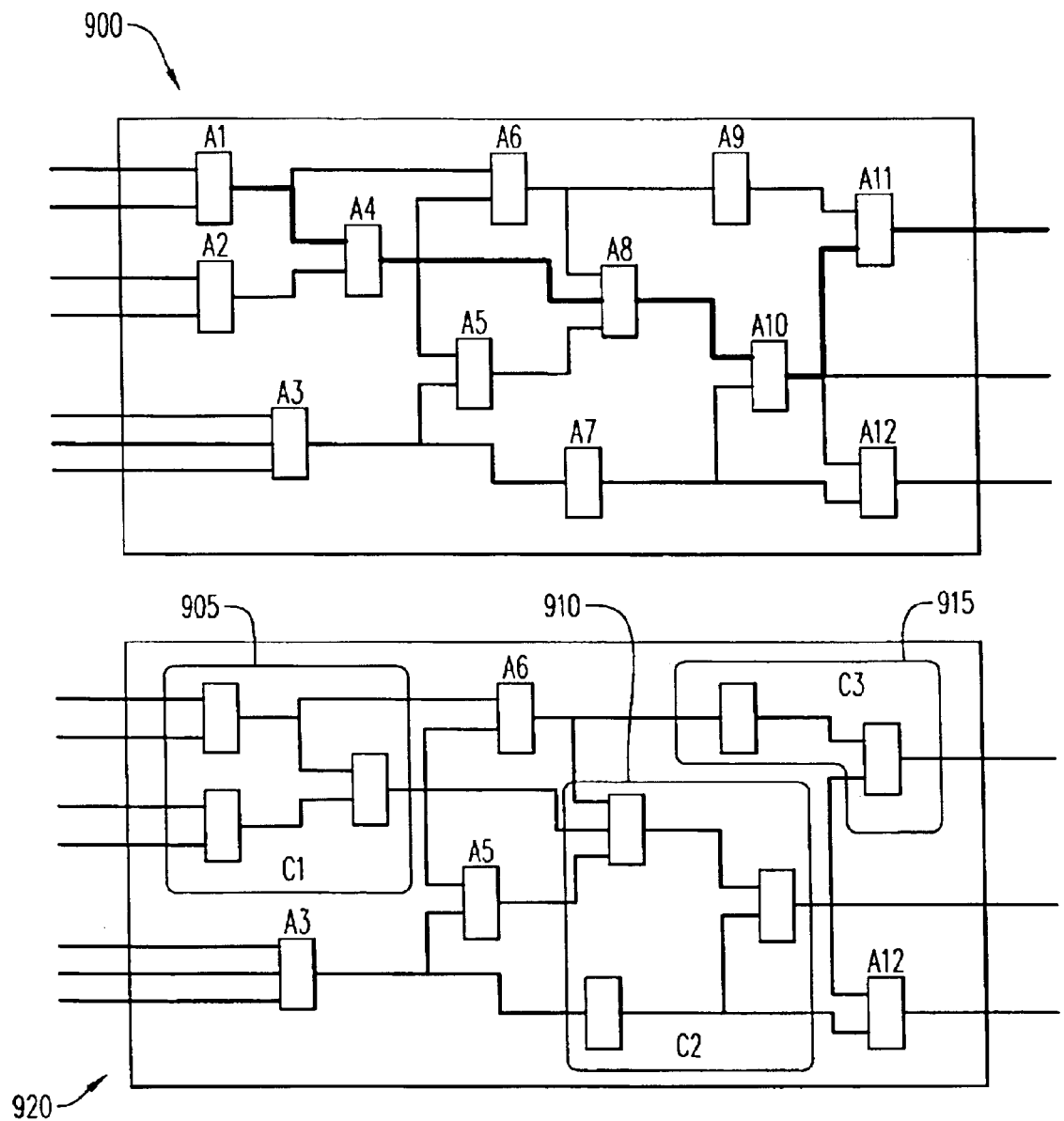
FIG. 9 is an exemplary abstraction of characterizing and optimizing clusters of standard cells in accordance with the present invention: the circuit has a critical path through the cells A1-A4-A8-A10-A11.

A simplified, yet exemplary abstraction of optimizing clusters in accordance with the present invention is shown in FIG. 9. Circuit 900 includes standard cells A1, . . . , A12 with a critical path through the cells A1-A4-A8-A10-A11.

Circuit 900 is analyzed at the transistor-level in the areas of interest, i.e., on critical regions, by creating larger cells C1, C2 and C3, as shown in FIG. 9b at 905, 910, and 915, respectively. Cells C1, C2 and C3 are characterized at the transistor-level, and gate-level STA is performed using the new cells. This characterization results in a more accurate (and hence more aggressive!) timing analysis of the design under consideration.

An important aspect of this process is that larger standard-cells, corresponding to C1, C2 and C3 are created, characterized and modeled to comply with cell-level design methodology. It is also important to note that the number of intra-cell wires (i.e., interconnects) is smaller in circuit 920 than in circuit 900. This results in reduction in the number of non-characterized interconnects in the design. In fact, if computational resources were available to perform a detailed transistor-level analysis of the entire circuit 900 under consideration, one could get the most accurate analysis of the timing characteristics of the design. However, considering the practical limitations of computational resources, it is typically feasible to characterize only a few hundred new cells having 20–40 transistors per cell, in a reasonable amount of time such as 1–2 days.

In another aspect of the present teachings, it is noted is that the characterization method herein is beneficial even when the larger cells can be optimized by creating entirely new transistor structures that are functionally equivalent to the standard-cells that they replace.

It should also be appreciated by those skilled in the art that the particular method and systems of context-sensitive constraint driven uniquification and characterization and other aspects of the teachings herein are but examples of the present invention. For example, the methods disclosed herein may be implemented in a system including a computer programmed to execute program instructions for effectuating the IC design methods of the present invention. The program instructions may be embodied on a storage medium such as a hard disk drive, a CD-ROM, or any other computer readable media. Thus, the particular method and systems described herein do not limit the scope or variety of applications that the present invention may be suitably implemented. Thus, it should be understood that the foregoing description is only illustrative of a present implementation of the teachings herein. Various alternatives and modification may be devised by those skilled in the art without departing from the invention. Accordingly, the present invention is intended to embrace all such alternatives, modifications, and variances that fall within the scope of the appended claims.

What is claimed is:

1. An automated computer-implemented method for reducing the number of distinct integrated circuit (IC) logic cells generated to implement an IC design, said method comprising the steps of;

receiving a functional description for a cell;

receiving a design constraint for said cell, said design constraint related to a context-of-use for said cell in said IC design; and determining an implementation of said cell based on said functional description and said design constraint, wherein the distinct IC logic cells generated for implementing said IC design have a new functionality not present in a are-existing library used to implement said IC design and the number of distinct IC logic cells is reduced.

2. The method of claim 1, wherein said constraint is selected from a group of metrics consisting of: timing, power, area, noise margins, slew, input/output capacitances, switching capacitances, drive strength, footprint size, and pin-placement for said cell.

3. The method of claim 1, further comprising the step of determining a signature for said cell based on said functional description and said constraint.

4. The method of claim 3, wherein said signature is determined for utilizing said constraint.

5. The method of claim 3, wherein said signature comprises a constraint for timing of said cell.

6. The method of claim 5, wherein said constraint for timing of said cell comprises a sorted list of rise times and fall times.

7. The method of claim 6, further comprising the step of comparing said sorted set of rise and fall times against a sorted set of available rise and fall times of a cell available in a library, or of a cell created on-the-fly.

8. The method of claim 1, further comprising the steps of:

determining a signature for said cell based on said functional description and said constraint; and evaluating said signature against a signature of an existing cell to determine a possible match therewith.

9. The method of claim 8, wherein said signature is determined for utilizing said constraint.

10. The method of claim 8, wherein said signature comprises a constraint for timing of said cell.

11. The method of claim 1, wherein said step of determining comprises at least determining an implementation of one possible input permutation for said cell.

12. The method of claim 1, wherein said step of determining comprises at least determining an implementation of one possible input complement for said cell.

13. The method of claim 1, further comprising the step of characterizing said cell based on said constraint, wherein said constraint is related to a context-of-use for said cell in said IC design.

14. The method of claim 13, wherein said context-of-use includes at least a region of said IC design.

15. The method of claim 13, wherein said context-of-use is utilized to define a set of characterization vectors applicable to said cell.

16. The method of claim 15, wherein said context-of-use includes a factor not affecting the size of said set of characterization vectors applicable to said cell.

17. The method of claim 15, wherein said set of characterization vectors applicable to said cell comprises a set of restrictions on process corners at which said cell is characterized.

18. The method of claim 13, wherein characterization of said IC design is accomplished by characterizing partitions of said IC design at a transistor level.

19. The method of claim 18, wherein said partitions are realized as at least one standard-cell.

20. The method of claim 18, wherein said partitions are formed in a region of said IC design based on design criteria.

21. The method of claim 20, wherein said design criteria are selected from a group consisting of timing, area, power, and signal integrity.

22. The method of claim 18, wherein said partitions comply with a standard-cell based IC design flow.

23. A storage media including computer readable program instructions for an automated computer-implemented method for reducing the number of distinct integrated circuit (IC) logic cells generated to implement an IC design, said storage media comprising:

program instructions for receiving a functional description for a cell;

program instructions for receiving a design constraint for said cell, said design constraint related to a context-of-use for said cell in said IC design; and program instructions for determining an implementation of said cell based on said functional description and said design constraint, wherein the distinct IC logic cells generated for implementing said IC design have a new functionality not present in a pre-existing library used to implement said IC design and the number of distinct IC logic cells is reduced.

* * * * *